United States Patent [19]

Suscavage et al.

[11] Patent Number: 6,113,985
[45] Date of Patent: Sep. 5, 2000

[54] PROCESS FOR THE MANUFACTURE OF GROUP III NITRIDE TARGETS FOR USE IN SPUTTERING AND SIMILAR EQUIPMENT

[75] Inventors: Michael J. Suscavage, Shirley, Mass.; Meckie T. Harris, Nashua, N.H.; David F. Bliss, Arlington, Mass.; John S. Bailey; Michael Callahan, both of Temple, N.H.

[73] Assignee: The United States of America as represented by Secretary of the Air Force, Washington, D.C.

[21] Appl. No.: 09/300,053

[22] Filed: Apr. 27, 1999

[51] Int. Cl.[7] .................................................. C23C 16/08
[52] U.S. Cl. .............................. 427/255.39; 427/255.394
[58] Field of Search ...................... 427/255.39, 255.394; 264/603; 204/298.13, 298.12

[56] References Cited

U.S. PATENT DOCUMENTS

| | | | |
|---|---|---|---|
| 4,144,116 | 3/1979 | Jacob et al. | 427/85 |
| 5,055,246 | 10/1991 | Jalby et al. | 427/255.2 |
| 5,164,221 | 11/1992 | Someno et al. | 427/255.2 |
| 5,178,911 | 1/1993 | Gordon et al. | 427/255.2 |

OTHER PUBLICATIONS

Sylwester Porowski, Bulk and Homoepitaxial GaN–growth and characterisation, Journal of Crystal Growth, 1998, 153–158, 189/190, Elsevier Science B.V., Warsaw, Poland.
Y. Naoi* .K. Kobatake, S. Kurai, K. Nishino, H. Sato, M. Nozaki, S. Sakai, Y. Shintani, Characterization of bulk GaN grown by sublimation technique, Journal of Crystal Growth, 1998, 163–166, 189/190, Elsevier Science B.V., Warshaw, Poland.
R.J. Molnar, P.Maki, R. Aggarwal, Z.L. Liau, E.R. Brown, I. Melngailis W. Gotz, L.T. Romano, N.M. Johnson, Gallium Nitride Thick FIlms Grown by Hydride Vapor Phase Epitaxy, Symposium E "III–Nitride, SiC and Diamond for Electronic Devices", 1996, vol. 423, Mater. Soc. Symp. Proc., USA.
Glen A. Slack, T.F. McNelly, Growth of HIgh Purity AIN Crystals, Journal of Crystal Growth, 1976, 263–279, 34, North–Holland Publishing Company.
T. Detchprohm, K.Hiramatsu, N. Sawaki, I. Akasaki, The homoepitaxy of GaN by metalorganic vapor phase epitxy using GaN substrates, Journal of Crystal Growth, 1994, 170–174, 137, Elsevier.
Takao Ishii, Yasuo Tazoh, Shinataro Miyazawa, LiGaO2 single crystal as a lattice–matched substrate for hexagonal GaN thin films, Journal of Crystal Growth, 1998, 208–212, 189/190, Elsevier Science B.V.
H.P. Maruska,J.J. Tietjen, The Preparation and Properties of Vapor–Deposited Single Crystal–Line GaN, Applied Physics Letters, Nov. 15, 1969, 327–329, vol. 15 No. 10.

Primary Examiner—Shrive Beck
Assistant Examiner—Paul D. Strain
Attorney, Agent, or Firm—Stanton E. Collier

[57] ABSTRACT

Using a GaN growth furnace, at least three different techniques can be used for forming the targets for the deposition of thin films. In the first, nitrides can be deposited as a dense coating on a target backing plate for use as a target. In this approach, the backing plate is placed near the Group III metal. During processing, the Group III metal or metal halide vaporizes and reacts with the nitrogen source to deposit a dense polycrystalline layer on the backing plate. To build up a thick layer on the backing plate, the backing plate is repeatedly placed in the processing furnace until a satisfactory thickness is attained. For the second approach, a properly shaped reaction vessel, the dense, thick Group III nitride crust that forms on top of the Group III metal during the process can be used directly or mechanically altered to meet the size requirements for a sputtering target holder. As a third approach, the Group III nitride material can be ground into a fine powder using traditional ceramic powder processing methods and then pressed to consolidate the powder into a sputtering target. The third processing option would typically lead to a low density target; however, this "green" compact can then be reinserted into the same processing apparatus that the original powder was synthesized to infiltrate the open pores with the same or another group III metal nitride. This would produce a high density, thick target.

10 Claims, 1 Drawing Sheet

PROCESS FOR THE MANUFACTURE OF GROUP III NITRIDE TARGETS FOR USE IN SPUTTERING AND SIMILAR EQUIPMENT

A related patent application, Ser. No. 09/299,928, pending, filed Apr. 27, 1999 entitled, "Process and Apparatus for the Growth of Nitride Materials" is being filed herewith.

STATEMENT REGARDING FEDERALLY SPONSORED RESEARCH OR DEVELOPMENT

The invention described herein may be manufactured and used by or for the Government for governmental purposes without the payment of any royalty thereon.

BACKGROUND OF THE INVENTION

The present invention relates to semiconductor materials, and, in particular, relates to targets of these materials used for sputtering and the like for the deposition of thin films, etc.

DESCRIPTION OF RELATED ART

This invention is related to the use of ammonium chloride, ammonium bromide, or ammonium iodide reacting with Group III metals or alloys with the resultant nitride products being used as targets in physical deposition processes. Currently, only low purity, low density aluminum nitride targets are available commercially. Manufacturers will usually stipulate a best effort when trying to make a gallium nitride target. During a Cooperative Research and Development Agreement (CRADA) between a Government laboratory and an outside partner, two gallium nitride targets were examined to determine whether they were suitable for making thin films by the pulse laser deposition and sputtering deposition processes. The results of this testing may be enhanced by the present invention. The targets were made by a proprietary hot pressing and sintering process presently claimed by a non-related patent application. Although the gallium nitride target was made by a proprietary process, it is believed to have been made by a pressing and sintering process.

In the absence of methods for producing large metal nitride single crystals, growth of thick metal nitride films on alternative substrates (hetero-epitaxy) has been attempted as a means of producing large area substrates. A number of innovative schemes have been developed to overcome strain problems with thick epitaxial M-nitride layers ("Gallium Nitride Thick Films Grown by Hydride Vapor Phase Epitaxy," by R. J. Molnar et al., *Proceedings, 1996 MRS Spring Meeting*). However, additional expensive engineering steps required to grow adequate films for electronic devices make these processes undesirable.

The ideal choice for M-nitride epitaxy would be a substrate of the same material (homo-epitaxy) with an exact match of lattice parameter, crystal structure and thermal expansion coefficient. For this purpose, bulk growth of M-nitride material is intrinsically the most desirable approach to creating M-nitride substrates. Currently the only bulk growth of the nitride materials involves a very high pressure, (exceeding 20,000 atmospheres) and high temperature (above 1400° C.) reaction of nitrogen and the metal of choice which makes this a non-viable commercial process ("The Homoepitaxy of GaN by Metalorganic Vapor Phase Epitaxy using GaN Substrates," by T. Detchprohm et al., Journal of Crystal Growth 137 (1994) 170). The growth of AlN single crystals requires high temperature (>2000° C.) and corrosion resistant materials. ("Growth of High Purity AlN Crystals," by G. Stack et. al., Journal of Crystal Growth 34 (1976) 263). It is a difficult process to control.

The standard method of making targets does not work well for aluminum nitride and doesn't work at all for gallium or indium nitride. The steps usually involve pressing a fine powder in a die at room temperature and then sintering at high temperature in a controlled atmosphere or pressing the powder in a die at elevated temperature in a controlled atmosphere for an extended time, also referred to as hot pressing. Aluminum nitride does not sinter very well due to the refractory nature of the material and requires sintering aids. These sintering aids contaminate the aluminum nitride and it cannot be used for electronic applications. Gallium and indium nitrides decompose to the elements before they begin to sinter.

Thus, there exists a need for a process to make targets of nitride materials to be able to deposit thin films of this material for use in making semiconductor devices such as lasers.

BRIEF SUMMARY OF THE INVENTION

The apparatus uses a first reactant of ammonium halide such as ammonium chloride, ammonium bromide, or ammonium iodide to react with the desired metal to create the semiconductor nitride. In the apparatus, a first heat zone causes a source of ammonium halide vapor to react with a metal, being heated in a second heat zone, in a flow tube to form M-nitride, which deposits in a cooler region downstream in the chamber and/or immediately adjacent to the reaction area. The reaction temperature is typically in the range of 600° C. to 900° C., whereas the volatilization temperature of ammonium chloride is >200° C. A steep temperature gradient is maintained between the chloride region and the metal source region. The furnace design incorporates the capability to maintain the halide and the metal at two separate temperature zones. In the lower temperature zone, the solid reactant is vaporized and transported toward the molten metal. The reaction occurs in the higher temperature zone, where the metal reacts with the halide, producing the desired M-nitride and various by-products.

Using the above apparatus, at least three different techniques can be used for forming the targets. In the first, nitrides can be deposited as a dense coating on a target backing plate for use as a target. In this approach, the backing plate is placed near the Group III metal. During processing, the Group III metal or metal halide vaporizes and reacts with the nitrogen source to deposit a dense polycrystalline layer on the backing plate. To build up a thick layer on the backing plate, the backing plate is repeatedly placed in the processing furnace until a satisfactory thickness is attained. For the second approach, a properly shaped reaction vessel, the dense, thick Group III nitride crust that forms on top of the Group III metal during the process can be used directly or mechanically altered to meet the size requirements for a sputtering target holder. As a third approach, the Group III nitride material can be ground into a fine powder using traditional ceramic powder processing methods and then pressed to consolidate the powder into a sputtering target. The third processing option would typically lead to a low density target; however, this "green" compact can then be reinserted into the same processing apparatus that the original powder was synthesized to infiltrate the open pores with the same or another group III metal nitride. This would produce a high density, thick target.

Therefore, one object of the present invention is to provide a high density target of nitride material for use in sputtering and laser deposition.

Another object of the present invention is to provide a target of Group III nitride material.

Another object of the present invention is to provide several techniques of making a target of Group III nitride material.

Another object of the present invention is to provide a target of Group III nitride being close to 100% dense.

Another object of the present invention is to provide a target of Group III nitride having substantially no impurities.

Another object of the present invention is to provide processes of making a target of Group III nitride which is highly reproducible, of variable thickness and diameters.

These and many other objects and advantages of the present invention will be ready apparent to one skilled in the pertinent art from the following detailed description of a preferred embodiment of the invention and the related drawings.

DETAILED DESCRIPTION OF THE INVENTION

Figure 1:
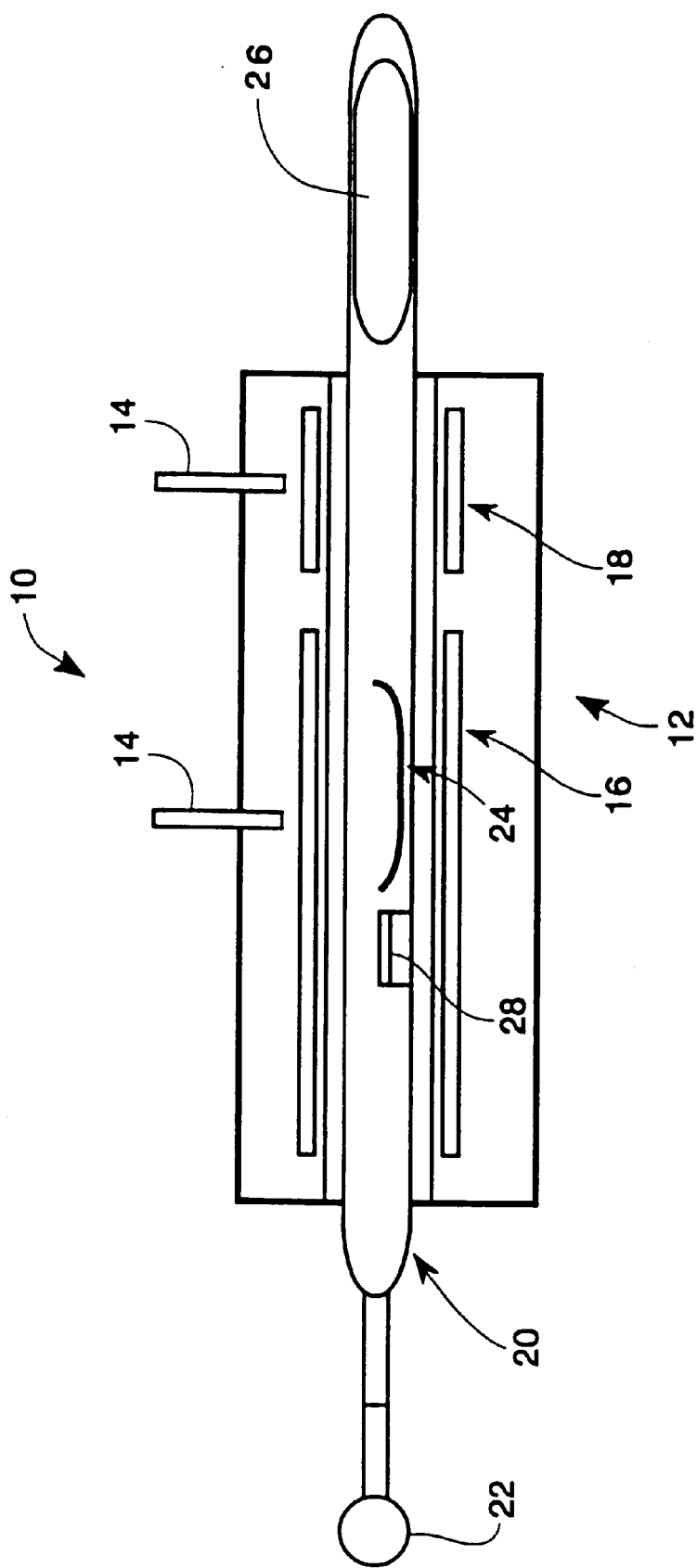
FIG. 1 illustrates by schematic a simplified growth furnace for making nitride targets of the present invention.

The purpose of this invention is to provide methods for making targets for physical deposition processes that include but are not limited to RF, DC, or Pulsed Laser Deposition of the Group III nitrides such as aluminum nitride (AlN), gallium nitride (GaN), and indium nitride (InN). Targets containing binary and ternary nitride alloys can also be made using this process.

A growth furnace 10 shown in FIG. 1 uses a first reactant of ammonium halide such as ammonium chloride, ammonium bromide, or ammonium iodide in a ammonium halide source 26 to react with the desired metal in a X-metal source 24 to create the semiconductor nitride as shown by the following equations:

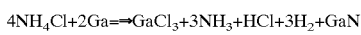

and further,

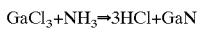

In the apparatus, a first heat zone 18 causes a source of ammonium halide vapor to react with a metal, being heated in a second heat zone 16, in a flow tube 12 to form M-nitride, which deposits in a cooler region downstream in the chamber and/or immediately adjacent to the reaction area. The reaction temperature is typically in the range of 600° C. to 900° C., whereas the volatilization temperature of ammonium chloride is >200° C. A steep temperature gradient is maintained between the chloride region and the metal source region. The furnace design incorporates the capability to maintain the halide and the metal at two separate temperature zones with thermocouples 14 to monitor the temperatures. In the lower temperature zone, the solid reactant is vaporized and transported toward the molten metal. The reaction occurs in the higher temperature zone, where the metal reacts with the halide, producing the desired M-nitride and various by-products. The flow tube 12 is inserted into a reaction chamber 20. By products are removed by means 22 which could be a one way filter.

Using the above apparatus, at least three different techniques can be used for forming the targets. In the first, nitrides can be deposited as a dense coating on a target backing plate 28 for use as a target. In this approach, the backing plate 28 is placed near the Group III metal source 24. During processing, the Group III metal or metal halide vaporizes and reacts with the nitrogen source to deposit a dense polycrystalline layer on the backing plate. To build up a thick layer on the backing plate, the backing plate is repeatedly placed in the processing furnace until a satisfactory thickness is attained.

For the second approach, a properly shaped reaction vessel, the dense, thick Group III nitride crust that forms on top of the Group III metal during the process in the X-metal source 24 can be used directly or mechanically altered to meet the size requirements for a sputtering target holder. As a third approach, the Group III nitride material can be ground into a fine powder using traditional ceramic powder processing methods and then pressed to consolidate the powder into a sputtering target. The third processing option would typically lead to a low density target; however, this "green" compact can then be reinserted into the same processing apparatus that the original powder was synthesized to infiltrate the open pores with the same or another group III metal nitride. This would produce a high density, thick target.

Pulsed Laser Deposition (PLD) sputtering targets were formed by using the backing plate method and the thick crust. One requirement for PLD sputtering targets is that the density must be high, probably above 85%, to decrease the likelihood of particles being ejected from the target and depositing on the substrate along with the growing film. Both of these targets produced films with very few or no particles imbedded in the surface.

Some of the advantages of using this method for making group III nitride sputtering targets are: the ability to attain close to 100% dense material; low impurity levels due to the use of high purity starting materials and minimal handling of the products; low manufacturing cost; good reproducibility; variable diameter and thickness.

Clearly many modifications and variations of the present invention are possible in light of the above teachings and it is therefore understood, that within the inventive scope of the inventive concept, that the invention may be practiced otherwise than specifically claimed.

What is claimed is:

1. A process for manufacturing targets of Group III nitride material, said process comprising the steps of:
    selecting a first reactant of ammonium halide material;
    placing the ammonium halide material in a halide source in a reaction chamber;
    selecting a metal;
    placing the metal in a metal source within the reaction chamber;
    heating the ammonium halide material in a first heat zone to form a vapor;
    heating the metal source in a second heat zone to react with the vapor of the ammonium halide material; and
    depositing a M-nitride material within the reaction chamber wherein M is a metal.

2. A process as defined in claim 1 further including the step of placing a target backing plate within the reaction chamber to receive M-nitride material.

3. A process as defined in claim 2 wherein a plurality of steps as defined in claim 1 are repeated to form a layer of desired thickness on the target backing plate.

4. A process as defined in claim 1 wherein the M-nitride material forms upon the metal source.

5. A process as defined in claim 4 wherein the M-nitride material is removed and processed to fit within a predetermined target holder.

6. A process as defined in claim 4 wherein the M-nitride material is removed and processed into a powder form and made into a target by pressing and sintering to form a low density target.

7. A process as defined in claim 6 wherein said low density target is placed within the reaction chamber and further infiltrated to close open pores therein to achieve a substantially 100% dense target.

8. A process as defined in claim 1 wherein the ammonium halide material is selected from the group consisting of ammonium chloride, ammonium bromide and ammonium iodide.

9. A process as defined in claim 1 wherein the metal is selected from aluminum, gallium, germanium and indium.

10. A process as defined in claim 1 wherein the M-nitride is aluminum nitride, gallium nitride and indium nitride.

* * * * *